United States Patent
Lee et al.

(10) Patent No.: US 9,142,466 B2
(45) Date of Patent: Sep. 22, 2015

(54) USING SPECTRA TO DETERMINE POLISHING ENDPOINTS

(71) Applicant: Applied Materials, Inc., Santa Clara, CA (US)

(72) Inventors: Harry Q. Lee, Los Altos, CA (US); Boguslaw A. Swedek, Cupertino, CA (US); Dominic J. Benvegnu, La Honda, CA (US); Jeffrey Drue David, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/041,113

(22) Filed: Sep. 30, 2013

(65) Prior Publication Data
US 2014/0045282 A1 Feb. 13, 2014

Related U.S. Application Data

(63) Continuation of application No. 12/306,174, filed on Feb. 22, 2008, now Pat. No. 8,569,174.

(60) Provisional application No. 60/891,487, filed on Feb. 23, 2007.

(51) Int. Cl.
| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *G06F 19/00* | (2011.01) |
| *H01L 21/66* | (2006.01) |
| *B24B 37/013* | (2012.01) |
| *B24B 49/12* | (2006.01) |
| *H01L 21/306* | (2006.01) |

(52) U.S. Cl.
CPC .............. *H01L 22/12* (2013.01); *B24B 37/013* (2013.01); *B24B 49/12* (2013.01); *H01L 21/30625* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,747,380 | A | 5/1998 | Yu et al. |
| 5,893,796 | A | 4/1999 | Birang et al. |
| 6,153,116 | A | 11/2000 | Yang et al. |
| 6,172,756 | B1 | 1/2001 | Chalmers et al. |
| 6,184,985 | B1 | 2/2001 | Chalmers et al. |

(Continued)

FOREIGN PATENT DOCUMENTS

| | | |
|---|---|---|
| EP | 1176631 | 1/2002 |
| JP | 2000-183001 | 6/2000 |

(Continued)

OTHER PUBLICATIONS

Office Action in JP Application No. 2013-127106, issued Jun. 3, 2014, 5 pages (with English translation).

(Continued)

*Primary Examiner* — Stephanie Duclair
(74) *Attorney, Agent, or Firm* — Fish & Richardson P.C.

(57) ABSTRACT

Methods of determining a polishing endpoint are described using spectra obtained during a polishing sequence. In particular, techniques for using only desired spectra, faster searching methods and more robust rate determination methods are described.

16 Claims, 7 Drawing Sheets

(56) References Cited

U.S. PATENT DOCUMENTS

| | | |
|---|---|---|
| 6,190,234 B1 | 2/2001 | Swedek et al. |
| 6,204,922 B1 | 3/2001 | Chalmers |
| 6,271,047 B1 | 8/2001 | Ushio et al. |
| 6,296,548 B1 | 10/2001 | Wiswesser et al. |
| 6,358,327 B1 | 3/2002 | Pokharna et al. |
| 6,361,646 B1 | 3/2002 | Bibby, Jr. et al. |
| 6,399,501 B2 | 6/2002 | Birang |
| 6,489,624 B1 | 12/2002 | Ushio et al. |
| 6,618,130 B2 | 9/2003 | Chen |
| 6,623,991 B2 | 9/2003 | Johnson et al. |
| 6,670,200 B2 | 12/2003 | Ushio et al. |
| 6,676,482 B2 | 1/2004 | Bibby, Jr. et al. |
| 6,678,046 B2 | 1/2004 | Opsal |
| 6,678,055 B2 | 1/2004 | Du-Nour et al. |
| 6,762,838 B2 | 7/2004 | Du-Nour |
| 6,768,967 B2 | 7/2004 | Johnson et al. |
| 6,801,321 B1 | 10/2004 | Du-Nour |
| 6,806,105 B2 | 10/2004 | Johnson et al. |
| 6,806,948 B2 | 10/2004 | Katz et al. |
| 6,813,034 B2 | 11/2004 | Rosencwaig et al. |
| 6,819,426 B2 | 11/2004 | Sezginer et al. |
| 6,836,328 B2 | 12/2004 | Opsal |
| 6,842,259 B2 | 1/2005 | Rosencwaig et al. |
| 6,885,467 B2 | 4/2005 | Du-Nour et al. |
| 6,898,596 B2 | 5/2005 | Aikens et al. |
| 6,908,374 B2 | 6/2005 | Wang et al. |
| 6,947,135 B2 | 9/2005 | Johnson |
| 6,995,842 B2 | 2/2006 | Opsal |
| 7,018,271 B2 | 3/2006 | Wiswesser et al. |
| 7,097,537 B1 | 8/2006 | David et al. |
| 7,255,771 B2 | 8/2007 | Chen et al. |
| 8,569,174 B2 | 10/2013 | Lee et al. |
| 2001/0039064 A1 | 11/2001 | Ushio et al. |
| 2002/0127951 A1 | 9/2002 | Ishikawa et al. |
| 2002/0155789 A1 | 10/2002 | Bibby, Jr. et al. |
| 2002/0173225 A1 | 11/2002 | Wang et al. |
| 2003/0002032 A1 | 1/2003 | DuNour |
| 2003/0022400 A1 | 1/2003 | Nomoto et al. |
| 2003/0053042 A1 | 3/2003 | Chen |
| 2003/0098704 A1 | 5/2003 | DuNour et al. |
| 2003/0153246 A1 | 8/2003 | Desai et al. |
| 2003/0184732 A1 | 10/2003 | Katz et al. |
| 2003/0205664 A1 | 11/2003 | Abe et al. |
| 2004/0080761 A1 | 4/2004 | Du-Nour et al. |
| 2004/0203177 A1* | 10/2004 | Davis et al. .................. 438/14 |
| 2005/0117164 A1 | 6/2005 | Nomoto et al. |
| 2005/0118812 A1* | 6/2005 | Donohue et al. .............. 438/689 |
| 2006/0020419 A1 | 1/2006 | Benvegnu |
| 2006/0274326 A1 | 12/2006 | Kobayashi et al. |
| 2007/0039925 A1 | 2/2007 | Swedek et al. |
| 2007/0042675 A1* | 2/2007 | Benvegnu et al. .................. 451/5 |
| 2008/0206993 A1 | 8/2008 | Lee et al. |

FOREIGN PATENT DOCUMENTS

| | | |
|---|---|---|
| JP | 2000-310512 | 11/2000 |
| JP | 2001-287159 | 10/2001 |
| JP | 2002-359217 | 12/2002 |
| JP | 2005-012218 | 1/2005 |
| JP | 2005-159203 | 6/2005 |
| JP | 2006-525593 | 11/2006 |
| JP | 2009-505847 | 2/2009 |
| WO | WO 00/54935 | 9/2000 |
| WO | WO 01/72470 | 10/2001 |
| WO | WO 2004/035265 | 4/2004 |
| WO | WO 2004/097723 | 11/2004 |
| WO | WO 2007/024807 | 3/2007 |

OTHER PUBLICATIONS

Annex to Form PCT/ISA/206, Communication Relating to the Results of the Partial International Search, International Application No. PCT/US2006/032659, Feb. 6, 2007, 3 pp.

International Search Report and Written Opinion of the International Searching Authority, International Application U.S. Appl. No. PCT/US2006/032659, May 16, 2007, 17 pp.

David et al., "Spectrum Based Polishing Control", U.S. Appl. No. 60/747,768, filed May 19, 2006, 56 pp.

International Search Report and Written Opinion of the International Searching Authority, International Application U.S. Appl. No. PCT/US2008/054807, Jul. 11, 2008, 11 pp.

Office Action in Japanese Application No. 2009-551052, dated Dec. 18, 2012, 4 pages (No English Translation).

Extended European Search Report in EP Application No. 08730580.1, dated Jul. 5, 2013, 7 pages.

Office Action in KR Application No. 10-2014-7032982, dated Jan. 12, 2015, 3 pages.

* cited by examiner

USING SPECTRA TO DETERMINE POLISHING ENDPOINTS

CROSS-REFERENCE TO RELATED APPLICATIONS

This application is a continuation of U.S. patent application Ser. No. 12/036,174, filed Feb. 22, 2008, which claims priority to U.S. Provisional Application Ser. No. 60/891,487, filed on Feb. 23, 2007. The disclosure of the prior applications is considered part of and is incorporated by reference in the disclosure of this application.

BACKGROUND

The present invention relates to generally to chemical mechanical polishing of substrates.

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing disk pad or belt pad. The polishing pad can be either a standard pad or a fixed abrasive pad. A standard pad has a durable roughened surface, whereas a fixed-abrasive pad has abrasive particles held in a containment media. The carrier head provides a controllable load on the substrate to push it against the polishing pad. A polishing slurry is typically supplied to the surface of the polishing pad. The polishing slurry includes at least one chemically reactive agent and, if used with a standard polishing pad, abrasive particles.

One problem in CMP is determining whether the polishing process is complete, i.e., whether a substrate layer has been planarized to a desired flatness or thickness, or when a desired amount of material has been removed. Overpolishing (removing too much) of a conductive layer or film leads to increased circuit resistance.

On the other hand, underpolishing (removing too little) of a conductive layer leads to electrical shorting. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, the polishing endpoint cannot be determined merely as a function of polishing time.

SUMMARY

Techniques are described for improving endpoint determination.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Described herein are systems for polishing substrates and determining a polishing endpoint. An optical detector is used to obtain spectra from a substrate during polishing. Once the spectra are obtained, the spectra are compared to spectra in a library. The comparison can be done using various techniques, such as least sum of the squares matching method, which is described further in U.S. application Ser. No. 11/213,344, filed Aug. 36, 2005, and U.S. application Ser. No. 60/747,768, filed May 19, 2006, which are incorporated herein for all purposes. If each spectrum in the library is assigned an index number, the matching index numbers can be plotted according to time and a line fit to the plotted index numbers using robust line fitting. When the line intersects the index corresponding to a target spectrum the target endpoint is reached and polishing can be stopped.

Spectra that are obtained to create the library and during polishing are prone to include noise or undesirable features. The spectra that include spurious data (e.g., due to noise or flashing a location such as a scribe line) can skew results when used to determine the endpoint. The spectra with noise will depart significantly from the "true" spectra that should result from a measurement of the substrate. These outlier spectra can be removed from the endpoint determination or can be compensated for using techniques described herein.

Figure 1:
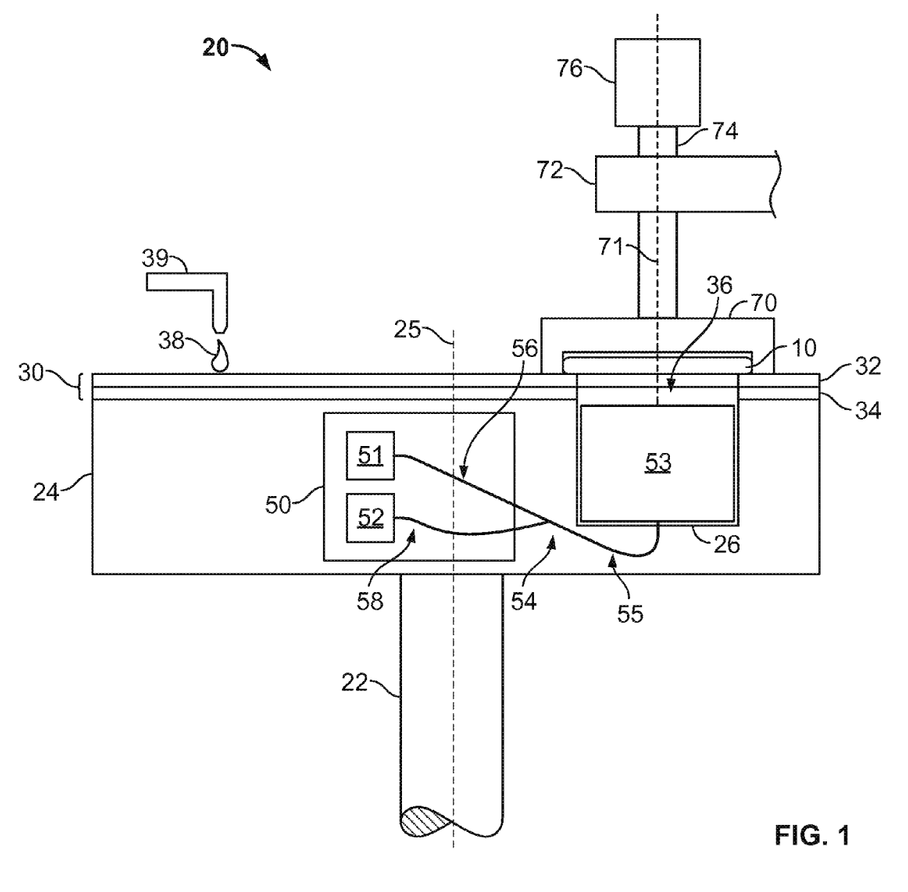
FIG. 1 is a schematic cross-sectional view of a polishing system.

FIG. 1 shows a polishing apparatus 20 operable to polish a substrate 10. The polishing apparatus 20 includes a rotatable disk-shaped platen 24, on which a polishing pad 30 is situated. The platen is operable to rotate about axis 25. For example, a motor can turn a drive shaft 22 to rotate the platen 24.

Optical access 36 through the polishing pad is provided by including an aperture (i.e., a hole that runs through the pad) or a solid window. The solid window can be secured to the polishing pad, although in some implementations the solid window can be supported on the platen 24 and project into an aperture in the polishing pad. The polishing pad 30 is usually placed on the platen 24 so that the aperture or window overlies an optical head 53 situated in a recess 26 of the platen 24. The optical head 53 consequently has optical access through the aperture or window to a substrate being polished. The optical head is further described below.

The polishing apparatus 20 includes a combined slurry/rinse arm 39. During polishing, the arm 39 is operable to dispense a polishing liquid 38, such as a slurry. Alternatively, the polishing apparatus includes a slurry port operable to dispense slurry onto polishing pad 30.

The polishing apparatus 20 includes a carrier head 70 operable to hold the substrate 10 against the polishing pad 30. The carrier head 70 is suspended from a support structure 72, for example, a carousel, and is connected by a carrier drive shaft 74 to a carrier head rotation motor 76 so that the carrier head can rotate about an axis 71. In addition, the carrier head 70 can oscillate laterally in a radial slot formed in the support structure 72. In operation, the platen is rotated about its central axis 25, and the carrier head is rotated about its central axis 71 and translated laterally across the top surface of the polishing pad.

The polishing apparatus also includes an optical monitoring system, which can be used to determine a polishing endpoint as discussed below. The optical monitoring system includes a light source 51 and a light detector 52. Light passes from the light source 51, through the optical access 36 in the polishing pad 30, impinges and is reflected from the substrate 10 back through the optical access 36, and travels to the light detector 52.

A bifurcated optical cable 54 can be used to transmit the light from the light source 51 to the optical access 36 and back from the optical access 36 to the light detector 52. The bifurcated optical cable 54 can include a "trunk" 55 and two "branches" 56 and 58.

As mentioned above, the platen 24 includes the recess 26, in which the optical head 53 is situated. The optical head 53 holds one end of the trunk 55 of the bifurcated fiber cable 54, which is configured to convey light to and from a substrate surface being polished. The optical head 53 can include one or more lenses or a window overlying the end of the bifurcated fiber cable 54. Alternatively, the optical head 53 can merely hold the end of the trunk 55 adjacent the solid window in the polishing pad. The optical head 53 can hold the above described nozzles of the flushing system. The optical head 53 can be removed from the recess 26 as required, for example, to effect preventive or corrective maintenance.

The platen includes a removable in-situ monitoring module 50. The in-situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 22 to the controller for the optical monitoring system. Similarly, the light source can be turned on or off in response to control commands in digital electronic signals that pass from the controller through the rotary coupler to the module 50.

The in-situ monitoring module can also hold the respective ends of the branch portions 56 and 58 of the bifurcated optical fiber 54. The light source is operable to transmit light, which is conveyed through the branch 56 and out the end of the trunk 55 located in the optical head 53, and which impinges on a substrate being polished. Light reflected from the substrate is received at the end of the trunk 55 located in the optical head 53 and conveyed through the branch 58 to the light detector 52.

In one implementation, the bifurcated fiber cable 54 is a bundle of optical fibers. The bundle includes a first group of optical fibers and a second group of optical fibers. An optical fiber in the first group is connected to convey light from the light source 51 to a substrate surface being polished. An optical fiber in the second group is connected to received light reflecting from the substrate surface being polished and convey the received light to a light detector. The optical fibers can be arranged so that the optical fibers in the second group form an X like shape that is centered on the longitudinal axis of the bifurcated optical fiber 54 (as viewed in a cross section of the bifurcated fiber cable 54). Alternatively, other arrangements can be implemented. For example, the optical fibers in the second group can form V like shapes that are mirror images of each other. A suitable bifurcated optical fiber is available from Verity Instruments, Inc. of Carrollton, Tex.

The light source 51 is operable to emit white light. In one implementation, the white light emitted includes light having wavelengths of 200-800 nanometers. A suitable light source is a xenon lamp or a xenon mercury lamp.

The light detector 52 can be a spectrometer. A spectrometer is basically an optical instrument for measuring intensity of light over a portion of the electromagnetic spectrum. A suitable spectrometer is a grating spectrometer. Typical output for a spectrometer is the intensity of the light as a function of wavelength.

Figure 2:
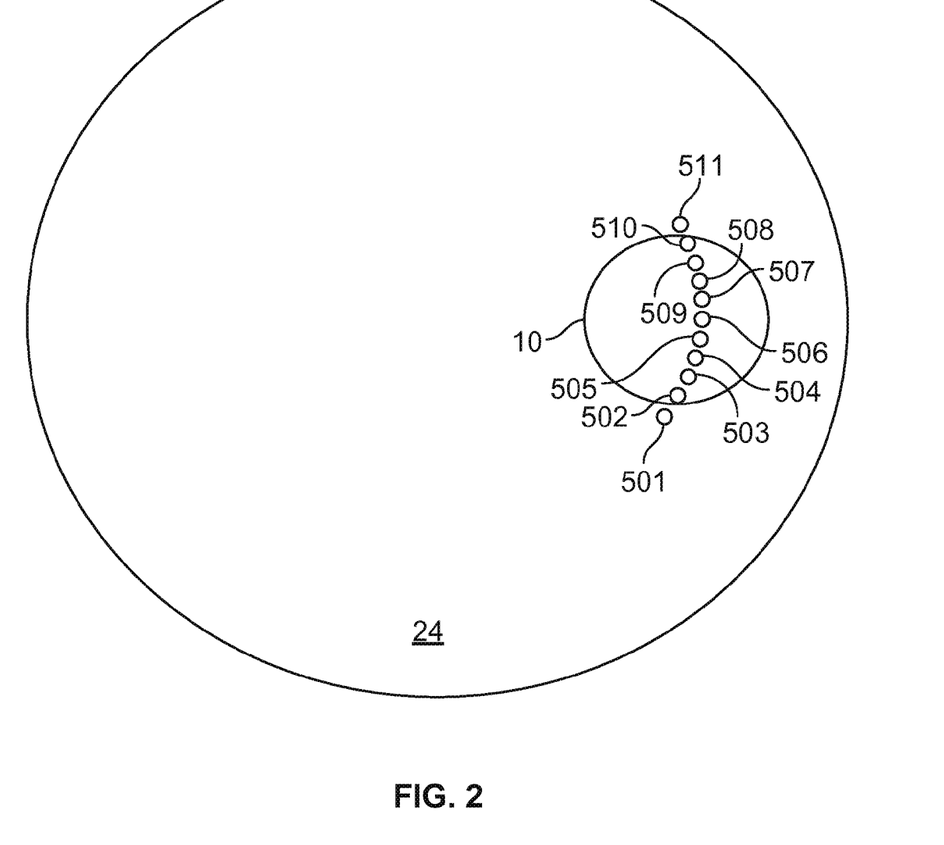
FIG. 2 is a schematic top view of a substrate on a platen with representative flash locations.

The light source 51 and light detector 52 are connected to a computing device operable to control their operation and to receive their signals. The computing device can include a microprocessor situated near the polishing apparatus, e.g., a personal computer. With respect to control, the computing device can, for example, synchronize activation of the light source 51 with the rotation of the platen 24. As shown in FIG. 2, the computer can cause the light source 51 to emit a series of flashes starting just before and ending just after the substrate 10 passes over the in-situ monitoring module. (Each of points 501-511 depicted represents a location where light from the in-situ monitoring module impinged and reflected off.) Alternatively, the computer can cause the light source 51 to emit light continuously starting just before and ending just after the substrate 10 passes over the in-situ monitoring module. Although not shown, each time the substrate 10 passes over the monitoring module, the alignment of the substrate with the monitoring module can be different than in the previous pass. Over one rotation of the substrate, spectra are obtained from different angular locations on the substrate, as well as from different radial locations. That is, some spectra are obtained from locations closer to the center of the substrate and some are closer to the edge. The substrate can be sectioned off in to radial zones. Three, four, five, six, seven or more zones can be defined on the surface of the substrate. In some of the methods described herein, spectra are grouped in their corresponding zones.

With respect to receiving signals, the computing device can receive, for example, a signal that carries information describing a spectrum of the light received by the light detector. The computing device can process the signal to determine an endpoint of a polishing step. Without being limited to any particular theory, the spectra of light reflected from the substrate evolve as polishing progresses. Properties of the spectrum of the reflected light changes as a thickness of the film changes, and particular spectra are exhibited by particular thicknesses of the film. The computing device can execute logic that determines, based on one or more of the spectra, when an endpoint has been reached. The one or more spectra on which an endpoint determination is based can include a target spectrum. Herein, target spectrum are referred to, but a reference spectrum is also intended to be covered. A target spectrum can be the spectrum that corresponds to a wafer when the polishing endpoint is achieved. Because of the lag time between the system receiving a stop polishing signal and the time that the platen stops rotating, the signal to stop polishing may be sent at a time prior to the actual endpoint, that is when a reference spectrum is achieved. Because the correlation between the reference spectrum and target spectrum depends on the polishing and system parameters, for the sake of simplicity, the target spectrum is referred to in this application.

As used in the instant specification, a target spectrum refers to a spectrum exhibited by the white light reflecting from a film of interest when the film of interest has a target thickness. By way of example, a target thickness can be 1, 2, or 3 microns. Alternatively, the target thickness can be zero, for example, when the film of interest is cleared so that an underlying film is exposed.

Figure 3:
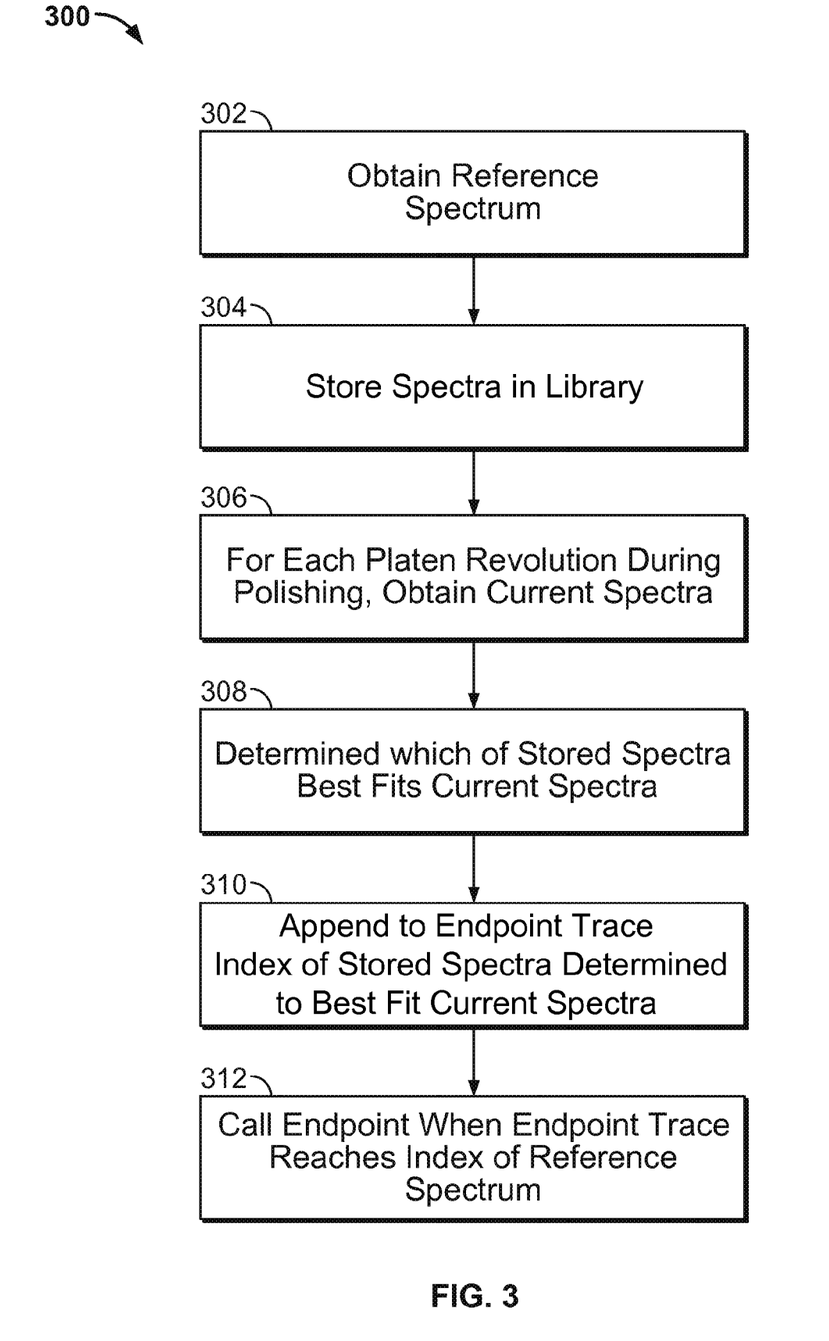
FIG. 3 is a flow diagram of determining a polishing endpoint.

FIG. 3 shows a method 300 for determining an endpoint of a polishing step. Spectra are collected from polishing a set up substrate (step 302). The spectra are stored in a library (step 304). Alternatively, the library can include spectra that are not collected but rather are calculated based on theory (e.g., from a model that includes expected thicknesses in the substrate and indexes of refraction of the layers). The spectra are indexed so that each spectrum has a unique index value. An index value can be selected to monotonically increase as polishing progresses, e.g., the index values can be proportional to a number of platen rotations. Thus, each index number can be a whole number, and the index number can represent the expected platen rotation at which the associated spectrum would appear. The library can be implemented in memory of the computing device of the polishing apparatus.

A substrate from the batch of substrates is polished, and the following steps are performed for each platen revolution. One or more spectra are measured to obtain a current spectra for a current platen revolution (step 306). The spectra stored in the library which best fits the current spectra is determined (step 308). The index of the library spectrum determined to best fit the current spectra is appended to an endpoint index trace (step 310). Endpoint is called when the endpoint trace reaches the index of the target spectrum (step 312).

In some embodiments, the indexes that are matched to each obtained spectrum are plotted according to time or platen rotation. A line is fit to the plotted index numbers using robust line fitting. Where the line meets the target index defines the endpoint time or rotation.

In some embodiments, the collected spectra are processed to enhance accuracy and/or precision. The processing techniques described herein can be used alone or in combination to improve the results of endpoint determination.

Figure 4:
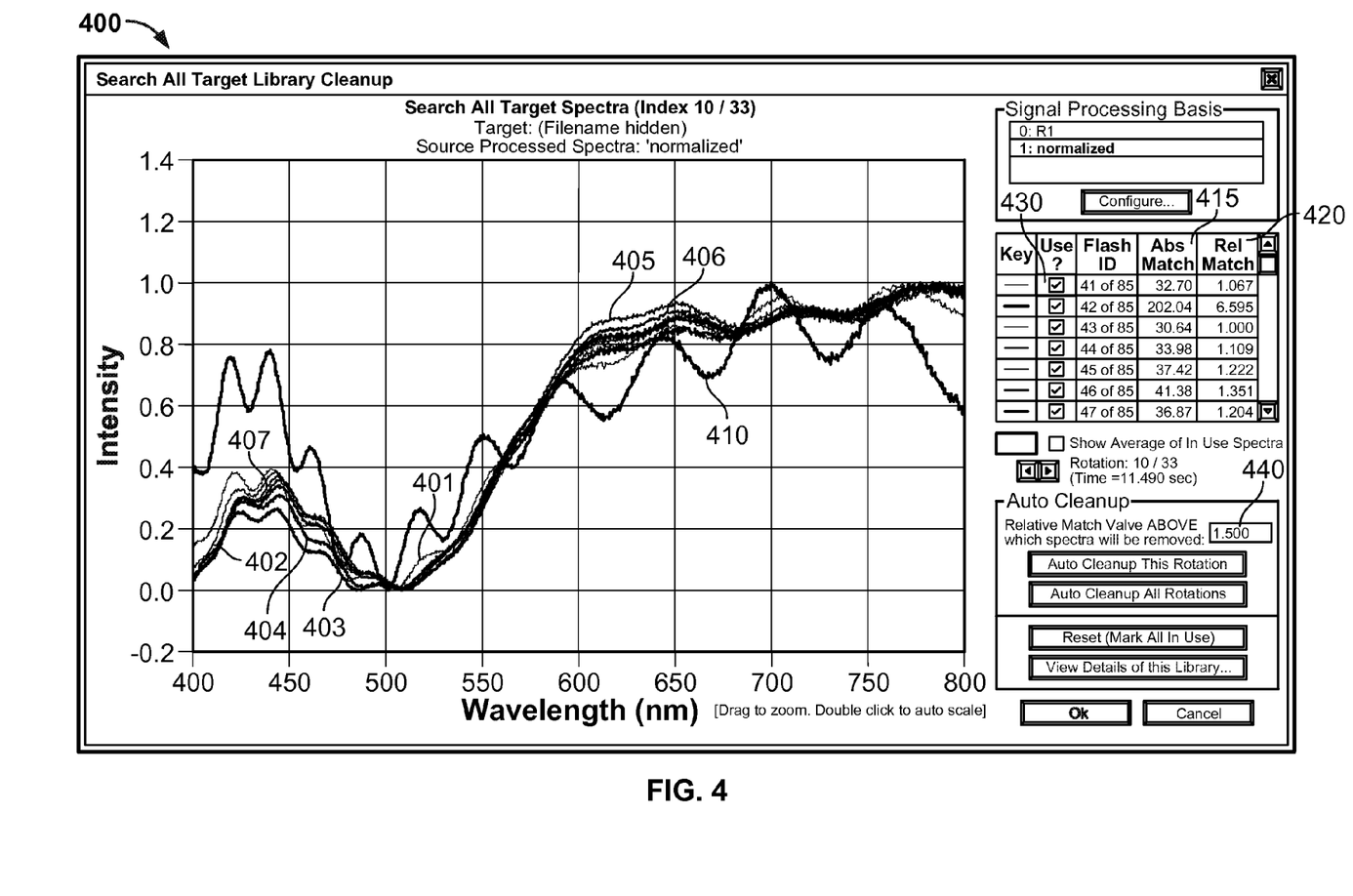
FIG. 4 is a representative GUI of spectra obtained for a library.

One method of improving the endpointing technique is to improve the library against which the sample data are compared. Referring to FIG. 4, a GUI 400 shows a graphical representation of the eight spectra obtained from a single zone on a substrate during a single rotation. One of the spectra 410 is significantly different from the rest. Here, seven of the spectra 401, 402, 403, 404, 405, 406, 407 appear to have similar intensities at each wavelength. However, one of the spectra 410 exhibits different intensities at most of the wavelengths from the other seven.

The outlier spectra can be visually determined and selected by the user. Alternatively, the system can automatically determine that there is an outlier spectra. The outlier can be found by calculating for each spectrum the cumulative sum of squares difference between the spectrum and all other spectra. In some embodiments, all of the spectra that are compared to one another are within the same radial zone and are obtained during a either the same rotation or within a predefined time period. The cumulative sum of squares difference 415 can be displayed on GUI 400. Optionally, this value can be normalized by dividing each spectrum by the lowest cumulative sum of squares difference for the spectra. The normalized results 420 can be displayed in the GUI. The spectrum with a normalized sum of squares value that exceeds a predetermined value or threshold 440, such as 1.5 or 2, is discarded. If the cumulative sum of squares difference is not normalized, the absolute value of the cumulative sum of squares difference can be used to determine which spectrum is an outlier. Again, a predefined value can be set as the threshold for the outlier. The predetermined value can be determined experimentally.

Figure 5:
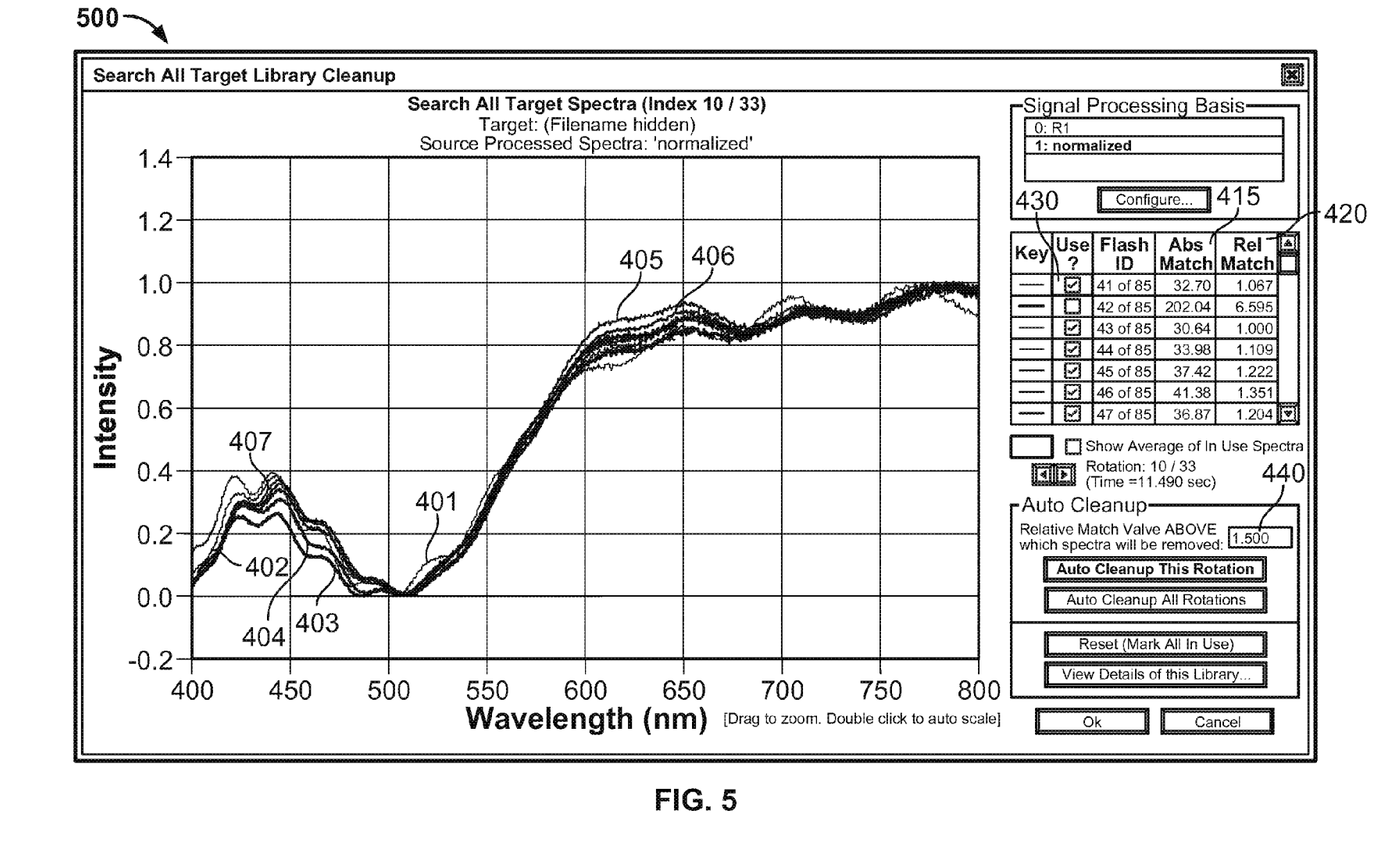
FIG. 5 is a representative GUI of spectra obtained for a library after an outlier spectrum has been removed.

Referring to FIG. 5, the remaining spectra can be displayed after the outlier is discarded. Because all of the spectra may be very close or there may be more than one outlier, the results can be visually inspected and altered by the user. The user can select which spectra to use by checking a box 430. Alternatively, the user can change the threshold 440 that defines which spectra are kept and which are discarded. Discarding the spectrum can mean simply not using that spectrum in subsequent calculations or deleting the spectrum.

Although eight spectra, or flashes, are shown, any number of spectra that are obtained during a rotation can be used. However, typically at least three spectra are desirable, and between five and ten spectra provide an adequate amount of data along with a desirable, i.e., fast, processing speed.

The automatic method applied to the library can similarly, or alternatively, be applied to the spectra obtained during substrate polishing. The source spectra used to generate an endpoint signal can be similarly sorted to discard any spectra which do not match the majority of measured spectra obtained during polishing. The outlier or outliers can be determined by calculating for each spectrum the cumulative sum of squares difference between the spectrum and all other spectra. Spectra taken during a single rotation are grouped together. Optionally, the spectra can be grouped into zones and single zones can be addressed individually. This value is normalized by dividing each spectrum by the lowest cumulative sum of squares difference for the spectra. The spectrum with a normalized sum of squares value that exceeds a predetermined value is discarded. The remaining spectra can be displayed for user review and editing after the outlier is discarded, such as for the user to determine whether the threshold should be reset for the next polishing sequence.

Another method that can be applied during the endpointing process is to limit the portion of the library that is searched for matching spectra. The library typically includes a wider range of spectra than will be obtained while polishing a substrate. The wider range accounts for spectra obtained from a thicker starting layer and spectra obtained after overpolishing. During substrate polishing, the library searching is limited to a predetermined range of library spectra. In some embodiments, the current rotational index N of a substrate being polished is determined. N can be determined by searching all of the library spectra. For the spectra obtained during a subsequent rotation, the library is searched within a range of freedom of N. That is, if during one rotation the index number is found to be N, during a subsequent rotation which is X rotations later, where the freedom is Y, the range that will be searched is (N+X)±Y. For example, if at the first polishing rotation of a substrate, the matching index is found to be 8 and the freedom is selected to be 5, for spectra obtained during the second rotation, only spectra corresponding to index numbers 9±5 are looked at for a match.

Alternatively, if the index numbers assigned to the spectra in the library approximate a platen rotation, then the library search can be limited to the predetermined freedom by the platen rotation. That is, if spectra are obtained at rotation 8 and the degrees of free is 6, the library can be searched for matches with spectra that are within 8 ±6.

Either of the above mentioned techniques can be faster than searching the entire library for a match. Increasing the processing speed can enable the spectra matching to be performed during substrate polishing to determine the endpoint. Additionally, this can prevent order skipping, that is, where a system provides the same spectra for layer thickness that differ by a regularly recurring thickness, such as 2000 angstroms, which can occur because spectra patterns tend to repeat.

Figure 6:
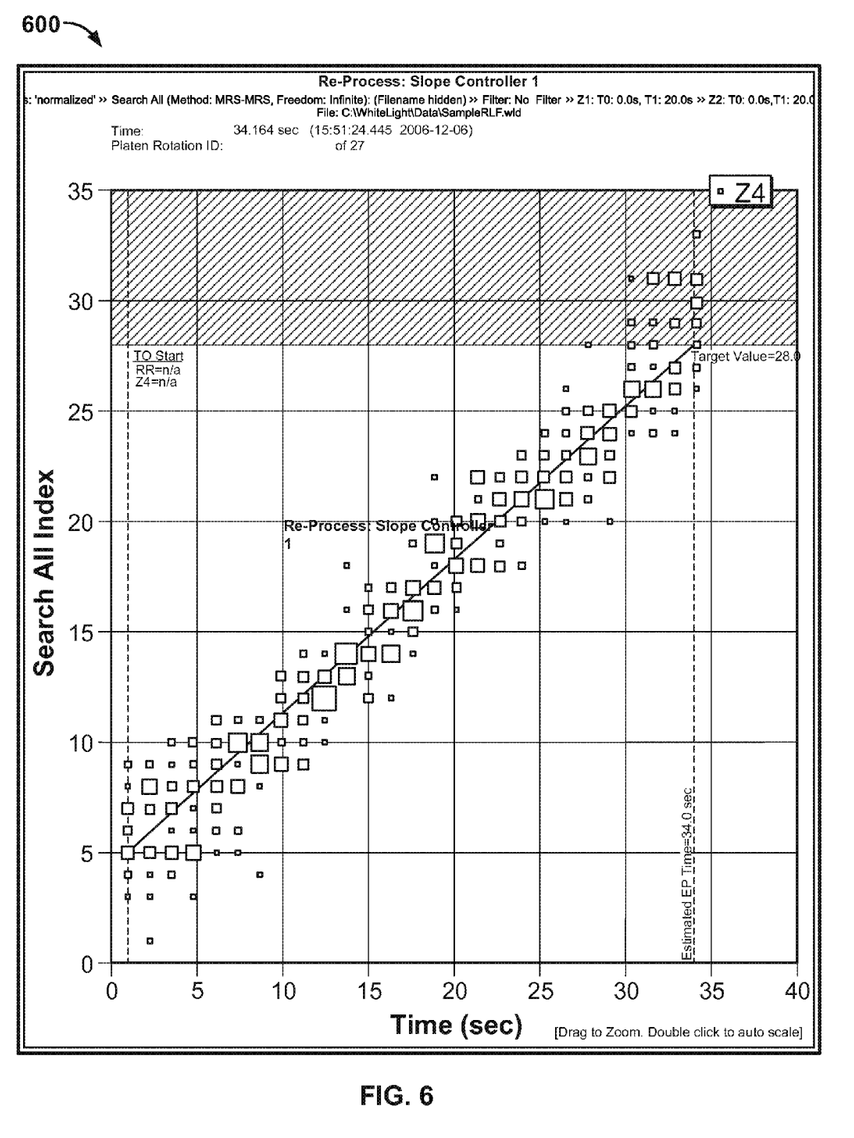
FIG. 6 is a graph showing multiple spectra and robust line fitting to determine endpoint.

As noted above, multiple spectra can be obtained during a single rotation. In one method of determining the endpoint, each spectrum is matched to an index number in the library. Each spectrum is then used for the robust line fit. The line corresponds to the rate of polishing. Referring to FIG. 6, graph 600 shows twenty spectra that were matched to rotational indices in the library and were plotted according to time. There is some scatter of the data due to each of the spectra matching up with different indices. The scatter may be due to non-uniform thicknesses within the zone, noisy data or a combination of factors. Where two or more spectra overlap, a larger symbol is drawn on the graph 600.

Figure 7:
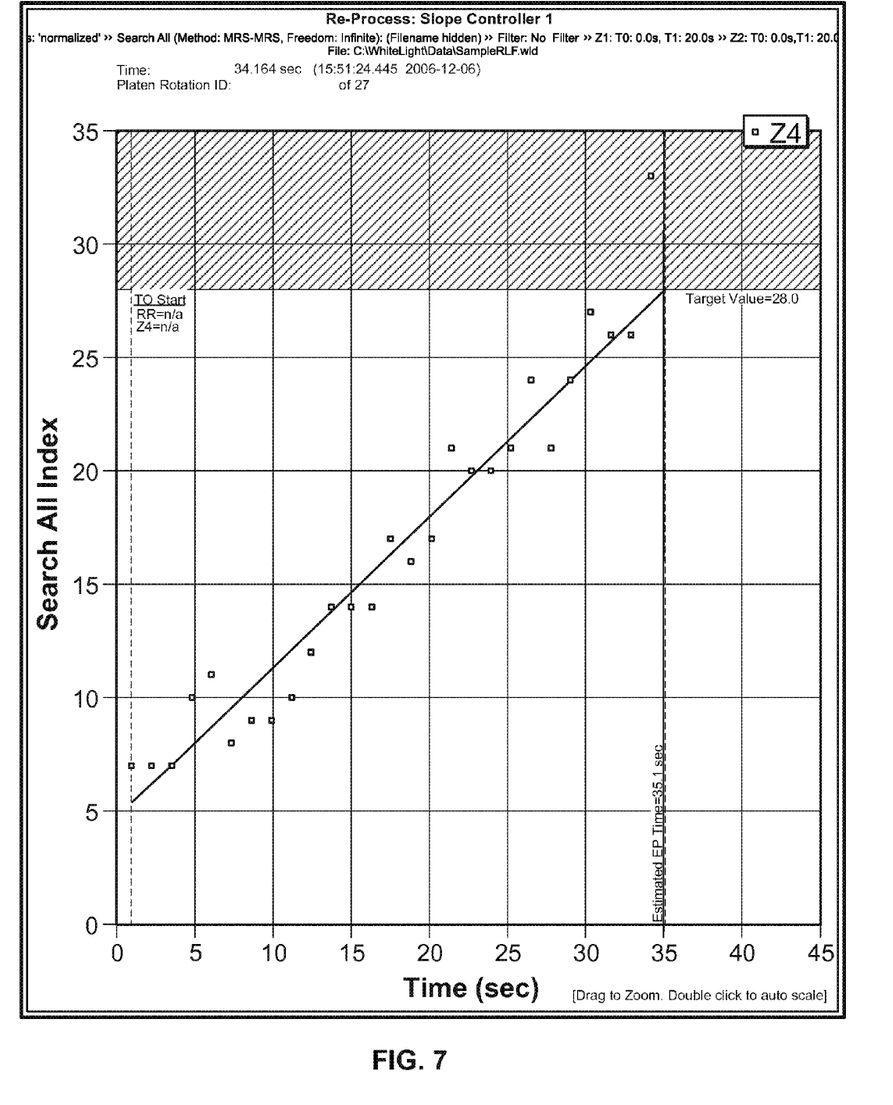
FIG. 7 is a graph showing spectra averaging and robust line fitting to determine endpoint.

As an alternative method, the spectra are first averaged and then matched to the library. Referring to FIG. 7, all spectra are averaged and the average spectrum is used to search the library for the best index match. Using the same raw spectra as used in the technique described with respect to FIG. 6, a different robust line fit result is obtained. This results in a different endpoint determination.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine-generated electrical, optical, or electromagnetic signal, that is generated to encode information for transmission to suitable receiver apparatus for execution by a computer. The computer readable medium can be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A method for determining outlier spectra, comprising:
   while polishing a substrate, obtaining at least three spectra from a surface of the substrate during a scan of an optical monitoring module across the substrate;
   calculating a cumulative sum of differences for each spectrum of the at least three spectra from the scan to generate at least three cumulative sums of differences, wherein calculating the cumulative sum of differences for the each spectrum includes calculating a sum of differences between the each spectrum of the at least three spectra of the scan and each of all other spectra of the at least three spectra of the scan to generate a plurality of sums of differences and summing the plurality of sums of differences to generate the cumulative sum of differences;
   selecting an outlier spectrum from the at least three spectra based on comparing the at least three cumulative sums of differences to a threshold; and
   discarding the outlier spectrum.

2. The method of claim 1, wherein calculating the sum of differences between the each spectrum of the at least three spectra and the each of all other spectra of the at least three spectra comprises calculating a sum of squared differences between the each spectrum and the each of the all other spectra of the at least three spectra.

3. The method of claim 1, wherein comparing the at least three cumulative sums of differences to the threshold comprises selecting a lowest cumulative sum of the at least three cumulative sums of differences and dividing each cumulative sum of differences by the lowest cumulative sum to obtain a normalized number for each spectrum of the at least three spectra.

4. The method of claim 3, wherein selecting the outlier spectrum comprises selecting the spectrum having a normalized number over a predetermined threshold.

5. The method of claim 1, wherein the scan of the optical monitoring module across the substrate corresponds to a single rotation of a platen supporting the optical monitoring module.

6. The method of claim 1, wherein the scan of the optical monitoring module across the substrate corresponds to a single rotation of a platen supporting the optical monitoring module.

7. A method of determining an endpoint, comprising:
   while polishing a substrate, obtaining at least three spectra from a surface of the substrate during a first scan of an optical monitoring module across the substrate;
   calculating a cumulative sum of differences for each spectrum of the at least three spectra of the first scan to generate at least three cumulative sums of differences, wherein calculating the cumulative sum of differences for the each spectrum includes calculating a sum of differences between the each spectrum of the at least three spectra of the first scan and each of all other spectra of the at least three spectra of the first scan to generate a plurality of sums of differences and summing the plurality of sums of differences to generate the cumulative sum of differences;
   selecting an outlier spectrum from the at least three spectra based on comparing the at least three cumulative sums of differences to a threshold;
   discarding the outlier spectrum; and
   comparing non-discarded spectra obtained from the first scan to a library of spectra to find a first matching spectrum.

8. The method of claim 7, further comprising:
   while polishing the substrate, obtaining at least three spectra from a surface of the substrate during a second scan of an optical monitoring module across the substrate;
   calculating a cumulative sum of differences for each spectrum of the at least three spectra of the second scan to generate at least three more cumulative sums of differences, wherein calculating the cumulative sum of differences for the each spectrum of the second scan includes calculating a sum of differences between the each spectrum of the at least three spectra of the second scan and each of all other spectra of the at least three spectra of the second scan to generate a second plurality of sums of differences and summing the second plurality of sums of differences to generate the cumulative sum of differences for the each spectrum of the at least three spectra of the second scan;
   selecting a second outlier spectrum from the at least three spectra of the second scan based on comparing the at least three more cumulative sums of differences to the threshold;
   discarding the second outlier spectrum;
   comparing non-discarded spectra obtained during the second scan to the library of spectra to find a second matching spectrum;
   determining a polishing rate based on a change of the first matching spectrum for the spectra of the first scan and the second matching spectrum for the spectra of the second scan; and
   projecting a polishing endpoint based on the polishing rate and a target spectrum.

9. The method of claim 7, wherein calculating the sum of differences between the each spectrum of the at least three spectra and the each of all other spectra of the at least three spectra comprises calculating a sum of squared differences between the each spectrum and the each of the all other spectra of the at least three spectra.

10. The method of claim 7, wherein comparing the at least three cumulative sums of differences to the threshold comprises selecting a lowest cumulative sum of the at least three cumulative sums of differences and dividing each cumulative sum of differences by the lowest cumulative sum to obtain a normalized number for each spectrum of the at least three spectra.

11. The method of claim 10, wherein selecting the outlier spectrum comprises selecting the spectrum having a normalized number over a predetermined threshold.

12. A computer program product, encoded on a tangible computer-readable storage device, operable to cause data processing apparatus to perform operations comprising:

receiving at least three spectra from a surface of the substrate during a scan of an optical monitoring module across the substrate;

calculating a cumulative sum of differences for each spectrum of the at least three spectra from the scan to generate at least three cumulative sums of differences, wherein calculating the cumulative sum of differences for the each spectrum includes calculating a sum of differences between the each spectrum of the at least three spectra from the scan and each of all other spectra of the at least three spectra from the scan to generate a plurality of sums of differences and summing the plurality of sums of differences to generate the cumulative sum of differences;

selecting an outlier spectrum from the at least three spectra based on comparing the at least three cumulative sums of differences to a threshold; and discarding the outlier spectrum.

13. The computer program product of claim 12, wherein calculating the sum of differences between the each spectrum of the at least three spectra and the each of all other spectra of the at least three spectra comprises calculating a sum of squared differences between the each spectrum and the each of the all other spectra of the at least three spectra.

14. The computer program product of claim 12, wherein comparing the at least three cumulative sums of differences to the threshold comprises selecting a lowest cumulative sum of the at least three cumulative sums of differences and dividing each cumulative sum of differences by the lowest cumulative sum to obtain a normalized number for each spectrum of the at least three spectra.

15. The computer program product of claim 14, wherein selecting the outlier spectrum comprises selecting the spectrum having a normalized number over a predetermined threshold.

16. The computer program product of claim 12, wherein the scan of the optical monitoring module across the substrate corresponds to a single rotation of a platen supporting the optical monitoring module.

* * * * *

UNITED STATES PATENT AND TRADEMARK OFFICE
CERTIFICATE OF CORRECTION

| | | |
|---|---|---|
| PATENT NO. | : 9,142,466 B2 | Page 1 of 1 |
| APPLICATION NO. | : 14/041113 | |
| DATED | : September 22, 2015 | |
| INVENTOR(S) | : Harry Q. Lee et al. | |

It is certified that error appears in the above-identified patent and that said Letters Patent is hereby corrected as shown below:

On the Title page, in the Related U.S. Application Data section, delete "12/306,174" and insert -- 12/036,174 --.

Signed and Sealed this
Fifteenth Day of March, 2016

Michelle K. Lee
*Director of the United States Patent and Trademark Office*